United States Patent
Toleno et al.

(10) Patent No.: US 10,806,053 B1
(45) Date of Patent: Oct. 13, 2020

(54) THERMALLY CONDUCTIVE TEXTILES FOR HEAT DISSIPATION FROM WEARABLE ELECTRONIC DEVICES

(71) Applicant: MICROSOFT TECHNOLOGY LICENSING, LLC, Redmond, WA (US)

(72) Inventors: Brian J. Toleno, Cupertino, CA (US); Gavin D. Stanley, Puyallup, WA (US); Douglas L. Heirich, San Jose, CA (US); Tzu-Yuan Lin, San Jose, CA (US); Sridhar Canumalla, Sammamish, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/523,555

(22) Filed: Jul. 26, 2019

(51) Int. Cl.
  *G06F 1/16* (2006.01)
  *G02B 27/01* (2006.01)
  *H05K 7/20* (2006.01)
  *G06F 1/20* (2006.01)

(52) U.S. Cl.
  CPC ....... *H05K 7/2039* (2013.01); *G02B 27/0176* (2013.01); *G06F 1/163* (2013.01); *G06F 1/1637* (2013.01); *G06F 1/203* (2013.01)

(58) Field of Classification Search
  CPC ... G02B 27/017; G02B 27/0176; G06F 1/163; H05K 7/2039; H05K 7/20436
  See application file for complete search history.

(56) References Cited

U.S. PATENT DOCUMENTS

| | | | | |
|---|---|---|---|---|
| 2,798,494 A | * | 7/1957 | Sukacev | A61N 1/28 607/96 |
| 3,566,409 A | * | 3/1971 | Hopper | A42B 1/08 2/414 |
| 4,483,021 A | * | 11/1984 | McCall | A42B 3/285 2/7 |
| 5,050,240 A | * | 9/1991 | Sayre | A42B 3/122 2/6.2 |
| 5,774,338 A | * | 6/1998 | Wessling, III | G06F 1/163 361/730 |
| 5,970,718 A | * | 10/1999 | Arnold | A61F 7/10 607/109 |

(Continued)

*Primary Examiner* — Adrian S Wilson
(74) *Attorney, Agent, or Firm* — Newport IP, LLC; Mike R. Cicero

(57) ABSTRACT

Techniques disclosed herein relate to using thermally conductive textiles for heat dissipation from wearable electronic devices. An exemplary thermally conductive textile may be constructed from an elasticated band for encircling a body part of a user (e.g., a user's head) and one or more thermally conductive wires that are affixed to the elasticated band in a wave pattern. The thermally conductive wires being arranged in the wave pattern allows for the thermally conductive wires to freely stretch and contract as forces are exerted on the elasticated band. Thus, the thermally conductive textile described herein exhibit elastic properties that are predominantly governed by the elasticated band while also exhibiting thermal properties that are predominantly governed by the thermally conductive wires. The thermally conductive textiles may also include locking fibers to restrict deformation of the wave pattern of the thermally conductive wires.

20 Claims, 6 Drawing Sheets

(56) References Cited

U.S. PATENT DOCUMENTS

| | | | |
|---|---|---|---|
| 6,282,089 B1* | 8/2001 | Nakanishi | G06F 1/163 |
| | | | 361/679.47 |
| 8,087,254 B2* | 1/2012 | Arnold | A41D 13/005 |
| | | | 62/3.5 |
| 9,883,550 B2 | 1/2018 | Comoglio et al. | |
| 9,924,271 B2 | 3/2018 | Lai et al. | |
| 10,182,937 B2* | 1/2019 | Smith | G01K 1/143 |
| 10,258,092 B2 | 4/2019 | Longinotti-Buitoni et al. | |
| 10,653,016 B1* | 5/2020 | Sullivan | G02B 27/0176 |
| 2002/0186180 A1* | 12/2002 | Duda | H04L 67/04 |
| | | | 345/8 |
| 2010/0199520 A1 | 8/2010 | Dua et al. | |
| 2011/0074380 A1 | 3/2011 | Jeon | |
| 2016/0212879 A1 | 7/2016 | Nikkhoo et al. | |
| 2017/0017279 A1* | 1/2017 | Saeidi | G04G 17/00 |
| 2018/0376626 A1* | 12/2018 | Hurbi | G06F 1/163 |
| 2019/0132948 A1* | 5/2019 | Longinotti-Buitoni | |
| | | | D06M 15/263 |
| 2019/0331928 A1* | 10/2019 | Lin | G02B 27/01 |

* cited by examiner

THERMALLY CONDUCTIVE TEXTILES FOR HEAT DISSIPATION FROM WEARABLE ELECTRONIC DEVICES

BACKGROUND

Thermal management presents unique challenges in the design of wearable electronic devices such as watches, head-mounted display (HMD) devices, or any other device that is designed to be worn by an individual during operation. Specifically, wearable electronic devices are typically more compact than other types of electronic devices. This compact nature of wearable electronic devices limits the total area of the surfaces that are available to dissipate heat. For example, in wearable electronic devices having a housing that encloses heat-emitting electronic components, the housing itself may lack sufficient surface area to remain at or below an allowable surface temperature while passively dissipating the full amount of heat emitted by the electronic components.

For these reasons, some wearable electronic devices include thermal management systems having heat spreaders to draw heat away from a component housing. A thermal management system for a smart watch may include, for example, a heat spreader that draws heat away from electronic components within a housing and into a wrist band that secures the watch onto a user's wrist. However, the heat spreader in such designs is typically a metallic material that is substantially inelastic and that extends straight through the wrist band or other support structure. An unfortunate result of such designs is that the support structure typically lacks suitable elastic properties to stretch and contract so as to comfortably conform to the user's body.

It is with respect to these and other considerations that the disclosure made herein is presented.

SUMMARY

Technologies described herein utilize thermally conductive textiles for dissipating heat from wearable electronic devices. Generally described, the techniques disclosed herein enable heat to be transferred away from a housing assembly that encloses heat emitting electronic components and into a support assembly that is at least partially constructed from a thermally conductive textile. As described in more detail below, an exemplary thermally conductive textile has elastic properties that allow for the support assembly to stretch and contract so as to comfortably conform to a user's body while also having thermal properties that allow for the support assembly to draw heat away from the housing assembly and to dissipate the heat into an ambient environment. An exemplary thermally conductive textile may be constructed from an elasticated band for encircling a body part of a user (e.g., a user's head) and one or more thermally conductive wires that are affixed to the elasticated band in a wave pattern. The thermally conductive wires being arranged in the wave pattern allows for the thermally conductive wires to freely stretch and contract as forces are exerted on the elasticated band. Thus, the various embodiments of support assemblies described herein utilizes thermally conductive textiles that exhibit elastic properties that are predominantly governed by the elasticated band while also exhibiting thermal properties that are predominantly governed by the thermally conductive wires.

Unlike conventional wearable device thermal dissipation systems, the systems and techniques described herein are not limited to dissipating heat into an ambient environment through an electronic component housing and/or support structures with integrated heat spreaders that are substantially in-flexible and, therefore, lack the elastic properties that are desirable for achieving optimal user comfort. Rather, the techniques described herein utilize thermally conductive textiles (e.g., elasticated textile materials having thermally conductive filaments affixed thereto and/or embedded therein) to optimize both the fit-and-feel of a wearable electronic device while also increasing the heat dissipation capabilities of the wearable electronic device.

In an exemplary embodiment, a head-mounted display (HMD) device comprises a housing assembly that at least partially encloses various computing components such as, for example, processors and/or batteries that emit heat during operation. The HMD device may also comprise a support assembly that is configured to maintain the housing assembly at a particular position with respect to a body part of a user during operation. More specifically, the support assembly may be coupled to the housing assembly to enable the housing assembly to be worn by the user at an appropriate location of the user's body. To illustrate this point, presume that the HMD device further includes a display that is mechanically coupled to the housing assembly and that is deployed to generate imagery within a field-of-view of the user during operation of the HMD device. In such an embodiment, the support assembly may be usable to couple the housing assembly to the user's head at a location so as to maintain the display within the field-of-view of the user.

The support assembly of the exemplary HMD device may include an elasticated band for at least partially encircling the user's head in order to secure the HMD device and the various components thereof at the appropriate location of the user's body. In some embodiments, the elasticated band is a flexible band that is made of textile fibers (e.g., cotton and/or polyester thread) that are integrally woven together with a plurality of elastic fibers (e.g., rubber strands) that provide for suitable elastic properties. For example, the elastic fibers may enable the elasticated band to stretch and contract so as to tightly encircle (e.g., tightly wraps around) the head of the user. The elasticated band may also be flexible enough so that the shape of the support assembly is adaptable to the shape of the head by the tension of the elasticated band being secured to the head.

The support assembly may further include a plurality of thermally conductive wires that are affixed to (e.g., stitched over the top of and/or embedded within) the elasticated band in a wave pattern. For example, in the various illustrated embodiments, the thermally conductive wires are shown to curve back and forth in a serpentine-type pattern. The thermally conductive wires may be constructed of metallic materials so as to have a high thermal conductivity. For instance, a copper-based material may have thermal conductivity of 385 W/m-K or higher dependent on the alloy used. In order to transfer heat away from the housing assembly and into the support assembly, individual wires of the plurality of thermally conductive wires are in thermal contact with the one or more computing components. In some embodiments, the plurality of thermally conductive wires may be comprised of a plurality of thermally conductive metallic strands that are woven into the elasticated band.

In some embodiments, the thermally conductive wires may be integrally woven together with the elastic fibers to form the thermally conductive textile. For example, each of the textile fibers (e.g., cotton and/or polyester thread), the elastic fibers (e.g., rubber strands) that provide for suitable elastic properties, and the thermally conductive wires that provide for suitable heat dissipation properties may be fed off of spools into a computer controlled loom machine that weaves these components together to form the thermally conductive textile. Additionally, or alternatively, the thermally conductive wires may be stitched to the elasticated band in the wave pattern after the elasticated band has already been constructed (e.g., woven on a computer-controlled loom machine). For example, each individual thermally conductive wire may be layered over the top of and then stitched to a band of flexible elastic tape in the wave pattern.

It should be appreciated that the integration of the thermally conductive wires in the wave pattern allows for elongation and contraction of the thermally conductive wires as the elastic fibers become elongated or contracted. This results in a thermally conductive textile material which exhibits elastic properties that are predominantly governed by the elastic fibers while also exhibiting the thermal properties that are predominantly governed by the thermally conductive wires.

In some embodiments, the support assembly, or the thermally conductive textile thereof, may further include substantially inelastic locking fibers that are woven in a pattern so as to limit deformation of the wave pattern which the thermally conductive wires are woven into. For example, the locking fibers may be woven in a pattern that results in the locking fibers exhibiting a tension spike when the elasticated band is elongated from a first length to a second length. This so called "tension spike" may result from the locking fibers being substantially inelastic (i.e., lacking an ability to stretch) and also woven into a pattern such that the locking fibers have slack therein until the elasticated band is elongated to the second length. Then, once the elasticated band reaches the second length, the locking fibers become taut (e.g., stretched or pulled tight, stressed, etc.) and prevent further elongation of the elasticated band, the thermally conductive wires, or any other components of the thermally conductive textile. Including the locking fibers to limit and/or restrict the amount of deformation that the thermally conductive wires experience has the specific purpose of ensuring that the thermally conductive wires do not become overly stressed/stretched which can lead to breakage, etc. For example, in an embodiment in which the thermally conductive wires are copper or some other metallic material, it will be appreciated that limiting the deformation thereof can extend the useful life of the product.

In some embodiments, the thermally conductive wires have a polymeric coating disposed over their outer surfaces. The polymeric coating may have a higher emissivity than the material from which the thermally conductive wires are constructed and, therefore, may increase the rate at which the support assembly radiates heat into an ambient environment. Furthermore, the polymeric coating may have a surface texture that improves the ability of a computer controlled weaving machine (e.g., a loom) to manipulate the thermally conductive wires. Thus, the polymeric coating may assist with a weaving process through which the thermally conductive textile is manufactured and may also increase the heat dissipation capabilities of the thermally conductive textile. Exemplary polymeric coating may include, but are not limited to, enamel coating and acrylic coatings.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

The following Detailed Description describes technologies for utilizing thermally conductive textiles for dissipating heat from wearable electronic devices. Generally described, the techniques disclosed herein enable heat to be transferred away from a housing assembly that encloses electronic components and into a support assembly that is constructed from a thermally conductive textile. As used herein, the term "thermally conductive textile" refers to a composite material in which various different materials are arranged so that elastic properties of the thermally conductive textile are predominantly governed by elastic fibers (e.g., rubber strands) whereas thermal properties of the thermally conductive textile are predominantly governed by thermally conductive wires (e.g., strands of copper thread). More specifically, the elastic properties allow for the thermally conductive textile to stretch and contract (e.g., so as to comfortably conform to a user's body) while the thermal properties allow for the thermally conductive textile to draw heat away from the housing assembly and to dissipate the heat into an ambient environment.

Thus, unlike conventional wearable device thermal dissipation systems, the techniques described herein are not limited to dissipating heat into an ambient environment through an electronic component housing and/or support structures with integrated heat spreaders that are substantially in-flexible. Rather, the techniques described herein utilize thermally conductive textiles to optimize both the fit-and-feel of a wearable electronic device (e.g., by exploiting elastic properties of the elastic fibers) as well as the heat dissipation capabilities of the wearable electronic device (e.g., by exploiting the thermal properties of the thermally conductive wires).

The techniques disclosed herein are believed to be applicable to a variety of approaches for utilizing thermally conductive textiles for dissipating heat from wearable electronic devices. Numerous aspects of the techniques disclosed herein are described in the specific context of utilizing thermally conductive textiles for dissipating heat from head-mounted display (HMD) devices. While the presently disclosed techniques are not necessarily limited to such embodiments, an appreciation of various aspects of the techniques disclosed herein is readily gained through a discussion of examples in the specific context of HMD devices. However, the disclosed techniques are applicable to dissipating heat from smart watches, chest-mounted fitness monitors, and other types of wearable electronic devices.

Figure 1:
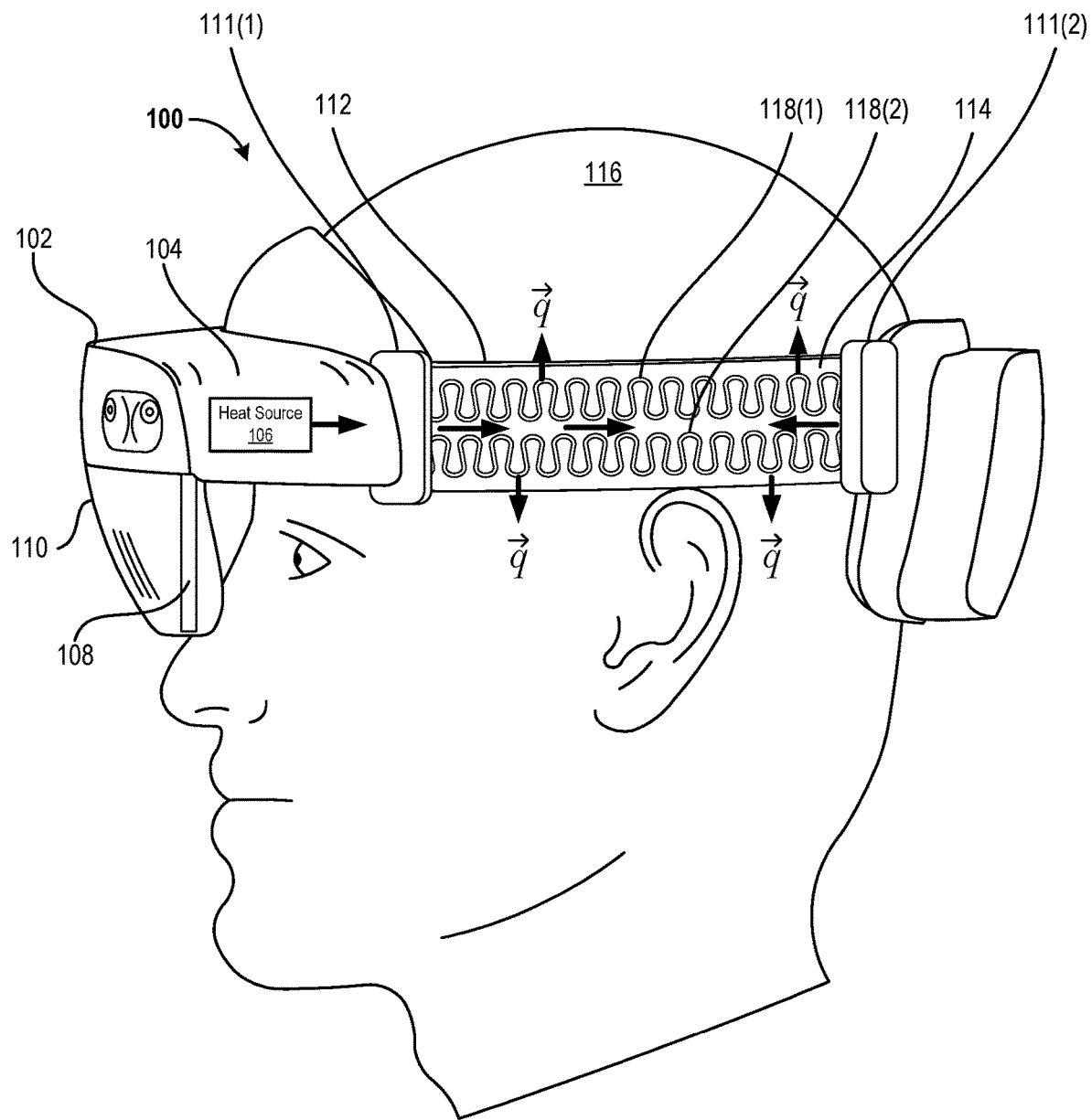
FIG. 1 is a side view of an exemplary thermal dissipation system that utilizes a thermally conductive textile to enables an HMD device to be worn by a user and also for dissipating heat from various electronic components of the HMD device.

Turning now to FIG. 1, illustrated is a side view of an exemplary thermal dissipation system 100 that is configured within an HMD device 102. As described in detail below, the thermal dissipation system 100 utilizes a thermally conductive textile that facilitates both the HMD device 102 to be worn by a user and also for dissipating heat from various electronic components of the HMD device 102.

In this example, the HMD device 102 includes a housing assembly 104 that at least partially encloses a heat source 106 such as, for example, a central processing unit, a graphics processing unit, and/or a battery. In the illustrated configuration, the HMD device 102 further includes a display 108 that is configured to generate images in front of a user's eye(s). For example, the HMD device 102 can be used for augmented reality (AR) and/or virtual reality (VR) applications. In embodiments where the HMD device 102 is usable for AR applications, the display 108 may be a transparent display element that enables the user to view the real-world environment surrounding her while concurrently viewing AR content (e.g., computer generated images) that is being generated by the display 108. In embodiments where the HMD device 102 is usable for VR applications, the display 108 may be an opaque display element that replaces the view the real-world environment with VR content (e.g., computer generated images) that is being generated by the display 108. The HMD device 102 may further include a visor 110 that is configured to protect one or both of the user's eyes and/or the display component 108 when the HMD device 102 is being worn by the user during operation.

As illustrated, the HMD device 102 includes a support assembly 112 that is configured to maintain the housing assembly 104 at a particular position with respect to a body part of a user during operation. More specifically, the support assembly 112 is coupled to the housing assembly 104 and enables the housing assembly 104 to be worn by the user at an appropriate location of the user's body. The support assembly 112 may be usable to couple the housing assembly 104 to the user's head at a location so as to maintain the display 108 within the field-of-view of the user. For example, thermally conductive textile portion of the support assembly 112 may be mechanically coupled to one or more end coupling elements 111 that are removably coupled to the housing assembly 104 that is mounted to the front of the user's head 116 and/or a second housing assembly 120 that is mounted to the rear of the user's head 116. In some embodiments, the second housing assembly 120 may at least partially enclose one or more second heat emitting components and the thermally conductive wires 118 may also draw heat out of the second housing assembly 120 for dissipation into the ambient environment.

The thermal dissipation system 100 may be at least partially incorporated into the support assembly 112. For example, the support assembly 112 may include an elasticated band 114 for at least partially encircling the user's head 116 in order to securely mount the HMD device 102 for use. Stated alternatively, the support assembly 112 may enable the HMD device 102, including the thermal dissipation system 100, to be worn by the user. The elasticated band 114 may be a flexible band that is made of textile fibers (e.g., cotton and/or polyester thread) that are integrally woven together with a plurality of elastic fibers (e.g., rubber strands). It will be appreciated that the elastic fibers that are woven into the elasticated band 114 may provide for suitable elastic properties for firmly securing the HMD device 102 to the user's head 116. In particular, the elastic fibers may enable the elasticated band 114 to stretch and contract so as to tightly encircle (e.g., tightly wraps around) the user's head 116. The elasticated band 114 may also be flexible enough so that the overall shape of the support assembly 112 is readily adaptable to the shape of the user's head 116.

With respect to the thermal dissipation system 100 being incorporated into the support assembly 112, the support assembly 112 may further include a plurality of thermally conductive wires 118 that are affixed to the elasticated band 114. In some embodiments, the thermally conductive wires 118 are arranged longitudinally along elasticated band 114 in a wave pattern. That is, the wave pattern of the thermally conductive wires 118 may propagate substantially parallel to a direction in which the elasticated band 114 is configured to stretch and contract (e.g., parallel to the elastic fibers woven therein). For example, as shown in FIG. 1, the thermally conductive wires 118 are shown to curve back and forth in a serpentine-type pattern that extends in the direction in which the elasticated band 114 wraps around the user's head 116. As described in more detail below, this arrangement of the wave pattern results in a wavelength of the wave pattern becoming longer when the elasticated band 114 stretches and shorter when the elasticated band 114 contracts.

In various embodiments, the thermally conductive wires 118 may be constructed of metallic materials that are specifically selected so as to have a high thermal conductivity. For instance, a copper-based material may have thermal conductivity of 385 W/m-K or higher dependent on the alloy used. In order to transfer heat away from the housing assembly 104 and into the support assembly 112, individual ones of the thermally conductive wires are specifically positioned to be in thermal contact with the heat source 106 (e.g., the processors, batteries, etc.). For example, the thermally conductive wires 118 may be in direct contact with the heat source 106 so as to absorb heat emitted therefrom and to draw the absorbed heat longitudinally through the support assembly 112. As another example, a thermal conduit (not shown in FIG. 1) may be disposed between the thermally conductive wires 118 and the heat source 106. Exemplary thermal conduits may be constructed of a heat pipe and/or flexible vapor chamber used to transfer heat from the heat source 106 to the heat sink thermally conductive wires 118 via convective heat transfer (also referred to herein as convection). For example, the thermal conduit may enclose a bi-phase fluid that is evaporated, from a liquid into a gas, within a segment of the thermal conduit that is positioned adjacent to the heat source. Then, this gas may condense within another segment of the thermal conduit that is positioned adjacent to the thermally conductive wires 118. In FIG. 1, the direction of heat travel is represented by several black arrows running from the heat source longitudinally along the support assembly 112. Moreover, the dissipation of the heat into the ambient environment is represented by several heat flux vectors that are individually labeled 4.

In some embodiments, the thermally conductive wires 118 are integrally woven together with the elasticated band 114 to form the thermally conductive textile of the support assembly 112. With respect to this point, it should initially be appreciated that a suitable construction for an elasticated band may include elastic fibers (e.g. rubber strands or threads) that extend in parallel along a specific direction that the elasticated band is intended to stretch and contract. It should further be appreciated that these elastic fibers or strands may be woven together with textile fibers such as, for example, cotton and/or polyester thread. During the construction of such an elasticated band, both the elastic fibers and the textile fibers may be fed off of spools into a computer-controlled loom machine (e.g. a computer numeric controlled (CNC) Jacquard loom) that weaves these components together to form the elasticated band. Expanding on this construction process to integrally weave the thermally conductive wires 118 into the elasticated band 114 to form the thermally conductive textile(s) described herein, each of the textile fibers (e.g., cotton and/or polyester thread), the elastic fibers (e.g., rubber strands) that provide for suitable elastic properties, and the thermally conductive wires (e.g., stranded copper thread with a polymeric coating) that provide for suitable heat dissipation properties may be fed off of spools into a CNC loom machine that weaves these components together to form the thermally conductive textile.

Additionally, or alternatively, the thermally conductive wires may be stitched to the elasticated band 114 in the wave pattern after the elasticated band 114 has already been constructed (e.g., woven on a computer-controlled loom machine). For example, each individual thermally conductive wire 118 may be layered over the top of and then stitched to a band of flexible elastic tape in the wave pattern.

Figure 4A:
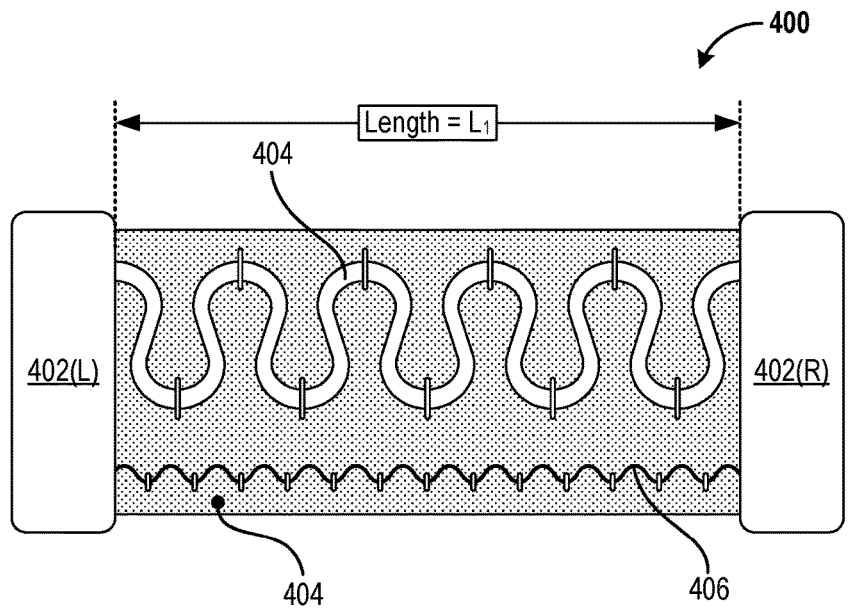
FIG. 4A illustrates an exemplary thermally conductive textile that is in relaxed state in which the end-to-end length of the thermally conductive textile is a first length.
Figure 4B:
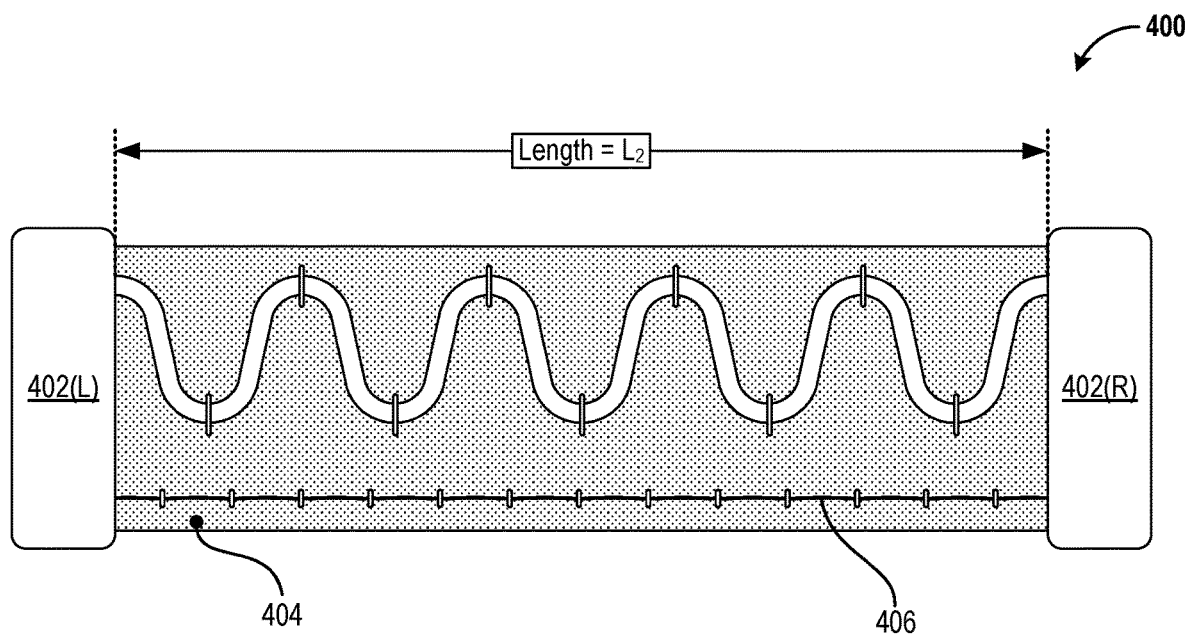
FIG. 4B illustrates the exemplary thermally conductive textile of FIG. 4A in a fully extended state in which the end-to-end length of the thermally conductive textile has been stretched to a second length.

As described in more detail with respect to FIGS. 4A and 4B, integration of the thermally conductive wires 118 in the wave pattern allows for elongation and contraction of the thermally conductive wires 118 as the elasticated band 114 becomes elongated or contracted. More specifically, at least over some range of motion in which the thermally conductive wires 118 remain un-taut (i.e., not fully lengthened or stretched out), the thermally conductive wires 118 may neither resist nor induce elongation or contraction—at least to any substantial degree when compared to the elastic fibers. The result of this is that elastic properties of the thermally conductive textile material are predominantly governed by the elastic fibers.

In some embodiments, a polymeric coating is deposited over the outer surfaces of the thermally conductive wires 118 to increase the effective emissivity of the thermally conductive wires 118. For example, the thermally conductive wires 118 may be constructed from strands of copper thread having a first emissivity ($\varepsilon_1$) when left in a bare or raw form. Then, when deposited over the thermally conductive wires 118, The polymeric coating may have a second emissivity ($\varepsilon_2$) that is greater than the first emissivity ($\varepsilon_1$). As a specific but non-limiting example, the first emissivity ($\varepsilon_1$) of the thermally conductive wires 118 in bare or raw form may be 0.5 whereas the second emissivity ($\varepsilon_2$) of the polymeric coating when deposited over the thermally conductive wires 118 may be 0.85. By increasing the effective emissivity of the thermally conductive wires 118, the polymeric coating may increase the rate at which the support assembly 112 radiates heat into an ambient environment. That is, a suitable polymeric coating may be applied to the thermally conductive wires 118 in order to increase the rate of heat dissipation into the ambient environment—as represented by several heat flux vectors that are individually labeled $\vec{q}$.

In addition to improving the thermal radiative properties of the thermally conductive wires 118, the polymeric coating may have a surface texture that improves the ability of a weaving machine (e.g., a CNC Jacquard loom) to manipulate the thermally conductive wires while weaving the thermally conductive textiles described herein. Thus, the polymeric coating may assist with a weaving process through which the thermally conductive textile is manufactured and may also increase the heat dissipation capabilities of the thermally conductive textile. Exemplary polymeric coating may include, but are not limited to, enamel coating and acrylic coatings.

Figure 2:
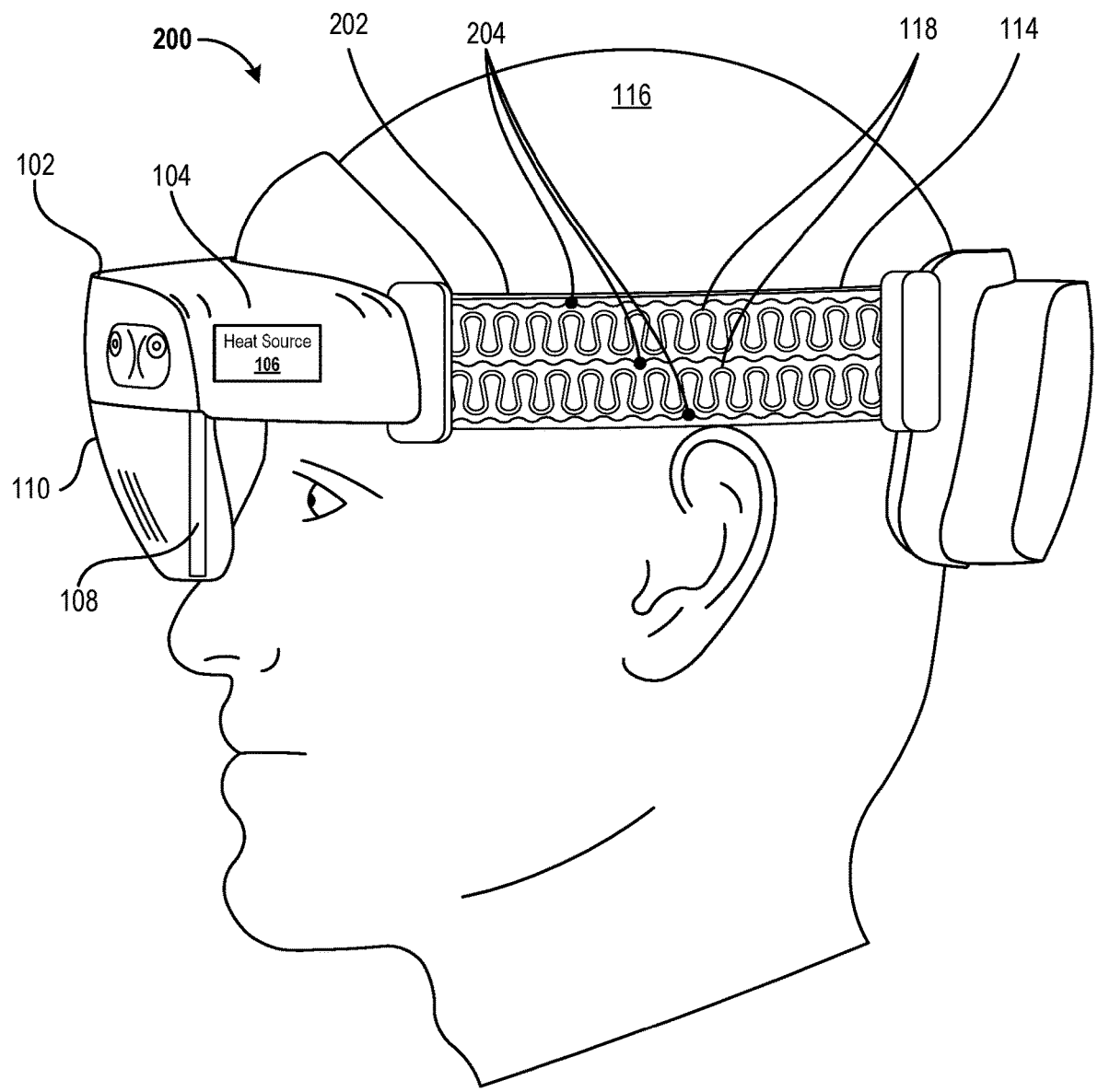
FIG. 2 is a side view of an alternate embodiment of a thermal dissipation system.

Turning now to FIG. 2, illustrated is a side view of an alternate embodiment of a thermal dissipation system 200 that is configured within an HMD device 102. As illustrated, the thermal dissipation system 200 includes a support assembly 202 that is configured to mount the HMD device 102 directly to the head of the user. Here, several aspects of the support assembly 202 are similar to the support assembly 112. For example, the support assembly 202 also includes a plurality of thermally conductive wires 118 that are affixed to an elasticated band 114. It will be appreciated that there are numerous other similarities between the systems shown in FIG. 1 and FIG. 2.

However, the support assembly 202 differs from the support assembly 112 due to the inclusion of a plurality of locking fibers 204 that are affixed to the elasticated band 114 in addition to the thermally conductive wires 114. The plurality of locking fibers 204 are configured to limit the length to which the support assembly 202 is able to stretch. For example, the locking fibers 204 may be affixed to the elasticated band 114 in a manner such that the locking fibers 204 have slack therein (i.e., are not taut) when the elasticated band 114 is not currently stretched out to some particular length.

In some embodiments, the locking fibers 204 may be woven into the elasticated band 114 in a pattern so as to limit deformation of the wave pattern which the thermally conductive wires are woven into. For example, the locking fibers 204 may be woven in a pattern that results in the locking fibers 204 exhibiting a tension spike when the elasticated band 114 is elongated from a first length to a second length. This so called "tension spike" may result from the locking fibers 204 being substantially inelastic (i.e., lacking an ability to stretch) and also woven into a pattern such that the locking fibers 204 have slack therein until the elasticated band is elongated to the second length. Then, once the elasticated band reaches the second length, the locking fibers 204 become taut (e.g., stretched or pulled tight, stressed, etc.) and prevent further elongation of the elasticated band 114, the thermally conductive wires 118, or any other components of the thermally conductive textile.

Figure 3:
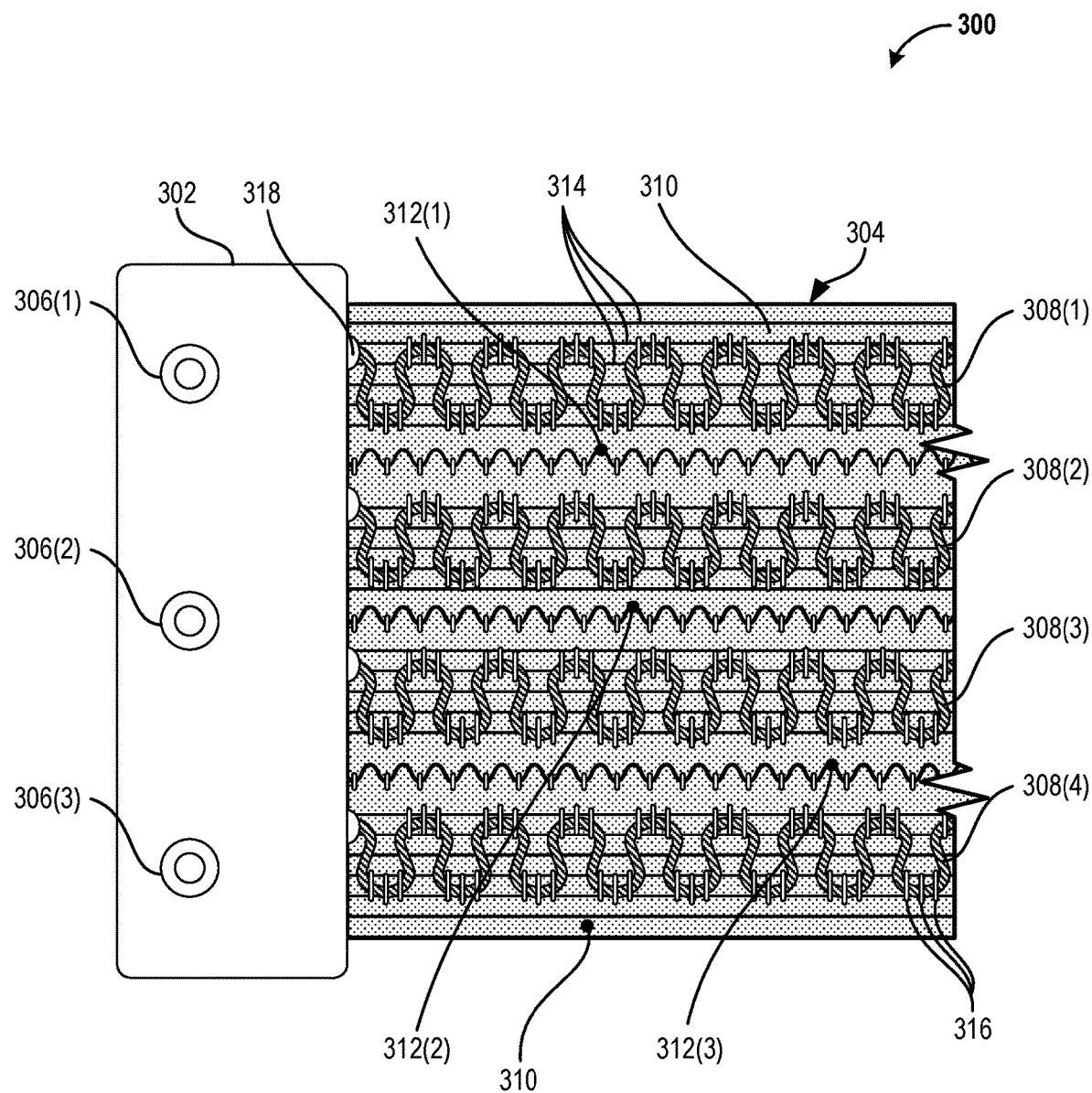
FIG. 3 illustrates a portion of an exemplary support assembly that includes a terminal connection element that is mechanically coupled to a thermally conductive textile.

Turning now to FIG. 3, illustrated is a portion of an exemplary support assembly 300 that includes a terminal connection element 302 that is mechanically coupled to a thermally conductive textile 304. The terminal connection element 302 may be a metal or plastic component that includes one or more mounting features 306 that facilitate mechanically coupling the support assembly 300 to a housing assembly that encloses heat emitting electronic components. For example, as illustrated, the terminal connection element 302 may include one or more countersunk mounting holes through which small screws may be passed through to tightly secure the support assembly 302 a housing assembly such as, for example, the housing assembly 104 of the HMD device 102 that is specifically illustrated in FIGS. 1 and 2.

As illustrated, the thermally conductive textile 304 includes a plurality of thermally conductive wires 308 that are woven into an elasticated band 310 in a first wave pattern. In the specific but nonlimiting example illustrated in FIG. 3, the first wave pattern is a serpentine-type pattern that extends longitudinally through the thermally conductive textile 304. The thermally conductive wires 308 are affixed to (e.g., stitched over the top of and/or embedded within) the elasticated band 310 so that the wave pattern becomes deformed as the elasticated band 310 stretches and contracts. Although the thermally conductive textile 304 is illustrated with precisely four thermally conductive wires—individually labeled 308(1) through 308(4)—it is within the scope of the present disclosure for the thermally conductive textile 304 to include more or less thermally conductive wires 308. Exemplary thermally conductive textiles may include tens and hundreds of thermally conductive wires 308 extending longitudinally along a direction in which the thermally conductive textiles are designed to repeatedly and elastically stretch and contract.

Exemplary thermally conductive wires may include, but are not limited to, metallic wires such as stranded copper wires, carbon nanotube (CNT) based materials, carbon-fiber-based materials, or any other type of material having suitable thermal properties. For example, the thermally conductive wires may be stranded copper wires having a thermal conductivity of 385 Watts/meter—Kelvin (or higher). As another example, the thermally conductive wires may be carbon nanotubes having a thermal conductivity of 3500 Watts/meter—Kelvin (or higher).

As further illustrated, the thermally conductive textile 304 includes a plurality of locking fibers 312 that are woven into the elasticated band 310 and a second wave pattern. It should be readily appreciated from a visual comparison of the first wave pattern with respect to the second wave pattern that the locking fibers 312 will become taut at a lesser degree of stretching than would take for the thermally conductive wires to become taut. In this way, the locking fibers are configured to limit deformation of the first wave pattern by exhibiting a tension spike when the thermally conductive textile 304 and/or the elasticated band 310 thereof is stretched in the longitudinal direction in which a plurality of elastic fibers 314 extend. For the purpose of reducing illustrative clutter, only the uppermost three of the plurality of elastic fibers 314 are labeled within FIG. 3. However, each of the individual horizontal black lines that are illustrated underneath individual ones of the thermally conductive wires 308 are included to represent individual elastic fibers 314.

In the illustrated embodiment of the thermally conductive textile 304, each individual one of the thermally conductive wires 308 and the locking fibers 312 are affixed to the elasticated band 310 via a plurality of stitches 316. An exemplary process for constructing such a thermally conductive textile, each individual thermally conductive wire 308 and/or each individual locking fiber 312 may be layered over the top of and then stitched to the elasticated band 310 after the elasticated band 310 has already been woven. In this way, the thermally conductive wires 308 and/or the locking fibers 312 may be woven into the elasticated band 310 in an appropriate wave pattern so as to form the thermally conductive textile 304.

In an exemplary embodiment, the thermally conductive wires 308 are comprised of a plurality of metallic filaments that are woven into the elasticated band 310 in the first wave pattern whereas the at least one locking fiber is a nonmetallic fiber that is woven into the elasticated band 310 in the second wave pattern. As a specific but nonlimiting example, the thermally conductive wires 310 may be comprised of a plurality of bundles of copper wire strands while the locking fiber may be comprised of at least one of a plurality of cotton filaments, plurality of polyester filaments, and/or a plurality of poly-cotton filaments.

In some embodiments, ends of the individual thermally conductive wires 308 may be metallically joined to the terminal connection element 302. For example, as illustrated, a small bead of solidified metal 318 may be deposited at a boundary between the terminal connection element 302 and individual ones of the thermally conductive wires 308. Exemplary processes for metallically joining the terminal connection element 302 to the individual thermally conductive wires 308 may include welding, brazing, soldering, or any other suitable process for joining these elements. It should be appreciated that by metallically joining the terminal connection element 3022 individual ones of the thermally conductive wires 308 heat transfer rates from the terminal connection element 302 into the thermally conductive wires 308 may be greatly improved. For this reason, metallically joining these elements may be particularly beneficial embodiments of wearable electronic devices in which the terminal connection element 302 is thermally coupled with the heat sources from which heat dissipation is desired.

Turning now to FIG. 4A, illustrated is an exemplary thermally conductive textile 400 that is in relaxed state in which the end-to-end length of the thermally conductive textile 400 is a first length of $L_1$. As illustrated, a right end of the thermally conductive textile 400 is coupled to a right terminal connection element 402(R) and a left end of the thermally conductive textile 400 is coupled to a left terminal connection element 402(L).

The thermally conductive textile 400 includes a single thermally conductive wire 404 that is woven into an elasticated band 404 in a first wave pattern. The thermally conductive textile 400 also includes a locking fiber 406 that is woven into the elasticated band 404 and a second wave pattern. Although various embodiments of the thermally conductive textiles disclosed herein may generally include tens or hundreds of thermally conductive wires and locking fibers, illustrating a single one of each is appropriate to illustrate the relative deformation of the first and second wave patterns (e.g., which result in the tension spike described herein).

It should be appreciated that in the illustrated embodiment although each of the thermally conductive wire 404 and the locking fiber 406 propagate in their respective wave pattern the first length of $L_1$, the first wave pattern is configured such that the total length of the thermally conductive wire 404 is greater than the total length of the locking fiber 406. For this reason, stretching the thermally conductive textile 400 to increase its overall length will result in the locking fiber 406 becoming taut at a point at which the thermally conductive wire 404 is still slack—although pattern may deform.

Turning now to FIG. 4B, illustrated is the exemplary thermally conductive textile 400 of FIG. 4A in a fully extended state in which the end-to-end length of the thermally conductive textile 400 has been stretched from the first length of $L_1$ to a second length of $L_2$. As illustrated, when the thermally conductive textile 400 is stretched out to the second length of $L_2$, the locking fiber 406 has become completely stretched out (e.g., pulled tight, taut) such that the locking fiber 406 prevents the thermally conductive textile 400 from stretching without any further. In this way, the locking fiber 406 exhibits a tension spike and, therefore, permits the thermally conductive textile 400 to be stretched out only a certain distance and then immediately prevents further stretching—due to becoming taut. An exemplary locking fiber 406 may be made from various non-metallic textile materials which are highly inelastic (e.g., materials which do not readily stretch or lengthen in response to applied forces).

As used herein, the term "tension spike" may refer to an occurrence of the locking fiber(s) that are affixed to a thermally conductive textile exhibiting a reactive tensile force that is substantially higher than the combined reactive tensile forces of the elasticated band and the thermally conductive wires—which are also affixed to the thermally conductive textile. For example, when a thermally conductive textile is stretched from the first length to the second length, the locking fiber(s) thereof may exhibit a reactive tensile force that is: five or more times greater than the combined reactive tensile forces of the elasticated band and the thermally conductive wires at the second length, ten or more times greater than the combined reactive tensile forces of the elasticated band and the thermally conductive wires at the second length, fifteen or more times greater than the combined reactive tensile forces of the elasticated band and the thermally conductive wires at the second length, fifty or more times greater than the combined reactive tensile forces of the elasticated band and the thermally conductive wires at the second length, or even one hundred or more times greater than the combined reactive tensile forces of the elasticated band and the thermally conductive wires at the second length.

Figure 5:
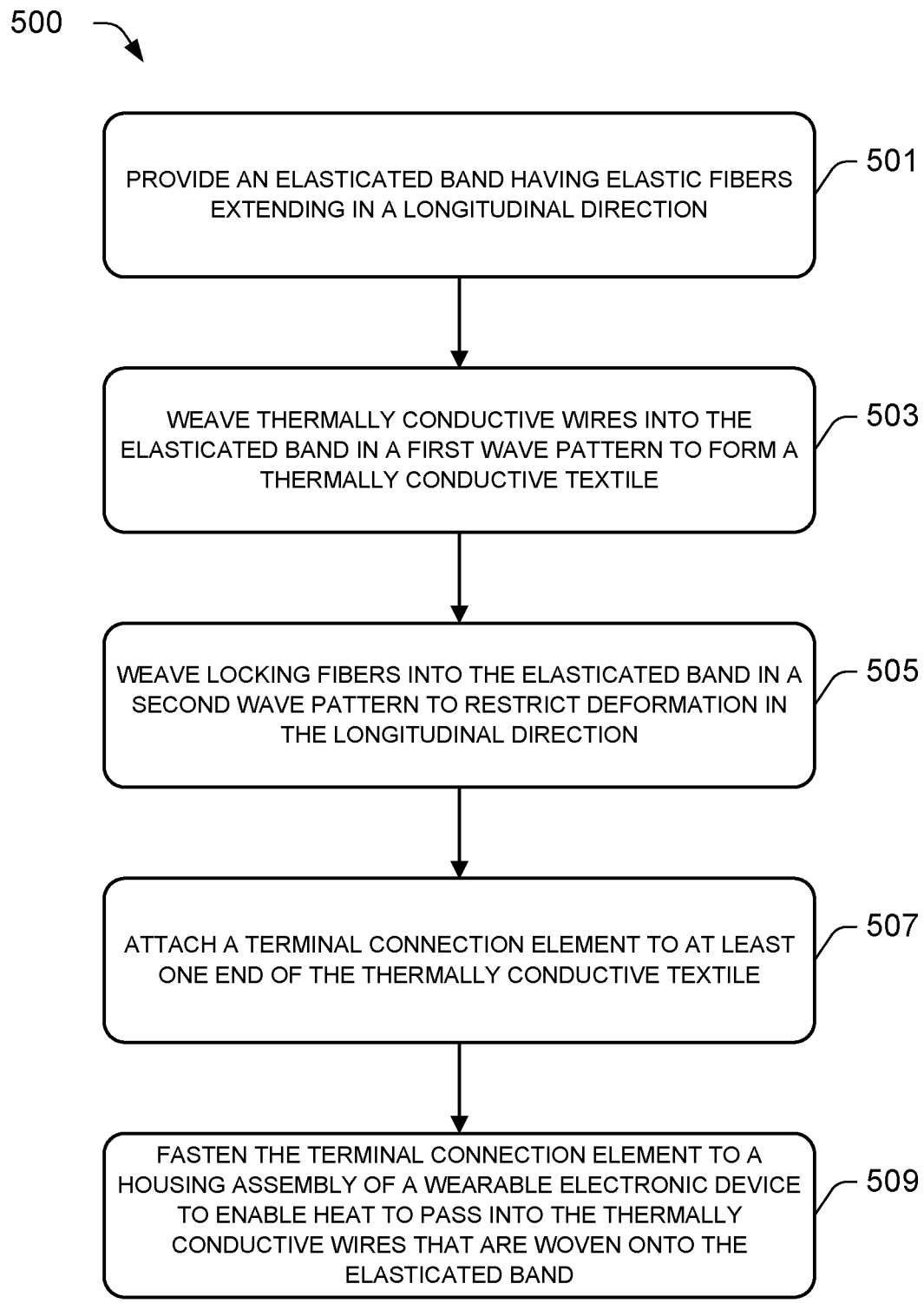
FIG. 5 is a flow chart that shows an exemplary process for manufacturing a thermally conductive textile that is usable for dissipating heat from a wearable electronic device.

Turning now to FIG. 5, a flow chart shows an exemplary process 500 for manufacturing a thermally conductive textile that is usable for dissipating heat from a wearable electronic device.

At block 501, an elasticated band is provided that includes a plurality of elastic fibers extending in a longitudinal direction. The elastic fibers may include an array of thin rubber strands that are woven together with a natural and/or synthetic thread. In some embodiments, the elasticated band may resemble a tape-like structure that lays flat against a surface and that that is woven with the elastic fibers (e.g., strips of rubber) so as to cause the elasticated band to return to its original length after being stretched in a longitudinal direction.

At block 503, a plurality of thermally conductive wires are woven onto the elasticated band in a first wave pattern. In this way, a thermally conductive textile is formed in the sense that an underlying textile material (e.g., the elasticated waist band) is interconnected and/or interwoven with a thermally conductive material (e.g., the plurality of metallic wires). In some embodiments, a polymeric coating is deposited onto the plurality of thermally conductive wires prior to the plurality of thermally conductive wires being woven onto the elasticated band in the first wave pattern. The polymeric coating may be specifically selected so as to increase an emissivity of the thermally conductive textile.

At block 505, a plurality of locking fibers are woven onto the elasticated band in a second wave pattern. As described above in detail with respect to FIGS. 4A and 4B, the first wave pattern and second wave pattern are specifically designed such that the plurality of locking fibers (which may be comprised of substantially inelastic natural or synthetic fibers) become taut in the event that the thermally conductive textile is stretched out to a particular length. For example, as described above, the locking fibers may be woven in a pattern that results in the locking fibers exhibiting a tension spike when the elasticated band is elongated from a first length to a second length. This "tension spike" may be a result of the locking fibers being substantially inelastic (i.e., lacking an ability to stretch) and also being woven into the elasticated band in a specific pattern such that the locking fibers are slack all the way until the elasticated band is elongated to the second length and then become immediately taut. In this way, the locking fibers do not contribute substantially to the aggregate tension exhibited by the thermally conductive textile at any length of stretching up until the second length. Then, at the second length the locking fibers may immediately exhibit substantially more tension than the combination of other material of the thermally conductive textile.

At block 507, a terminal connection element is attached to at least one end of the thermally conductive textile. As described above, the terminal connection element may be a metal or plastic component that includes one or more mounting features that facilitate mechanically coupling the support assembly to a housing assembly that encloses heat emitting electronic components. In some embodiments, attaching the terminal connection element to the thermally conductive textile includes metallically joining the terminal connection element to the plurality of thermally conductive wires. For example, the plurality of thermally conductive wires may be soldered, brazed, or welded to the terminal connection element.

At block 509, the terminal connection element is coupled to a housing assembly of the wearable electronic device in thermal contact with various electronic components that generate heat during operation of the wearable electronic device. This enables heat that is generated within the housing assembly of the wearable electronic device to pass into the plurality of thermally conductive wires that are woven onto the elasticated band in the first wave pattern. Once absorbed into the thermally conductive wires that are woven onto the elasticated band, the heat is then dissipated out the thermally conductive wires into the ambient environment.

Figure 6:
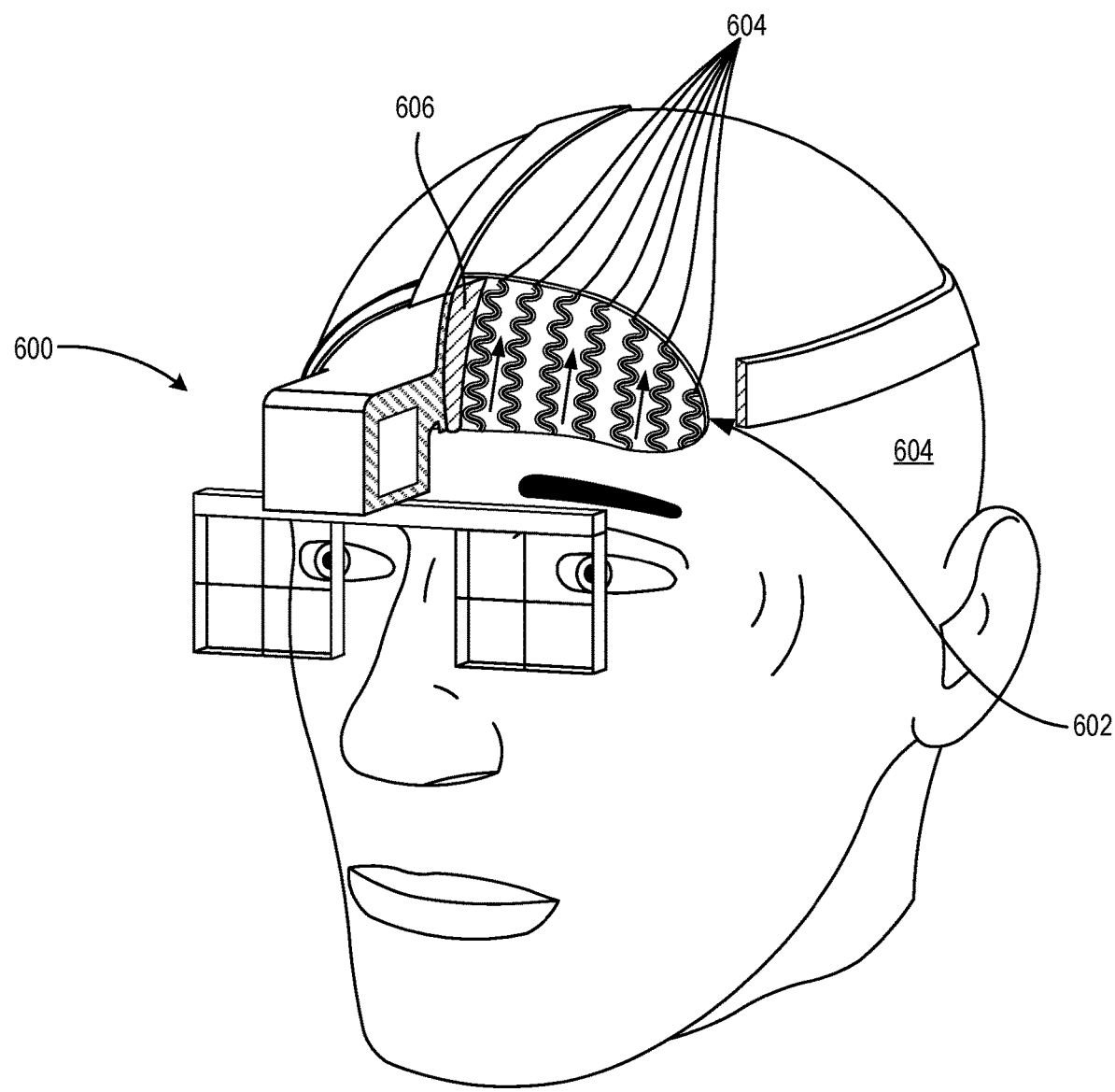
FIG. 6 is a cut-away perspective view of an exemplary HMD device having a thermally conductive textile that is in contact with a head of a user and is configured for spreading heat in a vertical direction.

FIG. 6 is a cut-away perspective view of an exemplary HMD device 600 having a thermally conductive textile 602 that is in contact with a head 604 of a user and is configured for spreading heat in a vertical direction. In particular, the thermally conductive textile 602 includes a plurality of thermally conductive wires that extend vertically from a bottom region of a brow pad 606 to a top region of the brow pad 606. This configuration may be desirable to prevent the bottom region of the brow pad 606 from becoming substantially hotter than the top region of the brow pad 606. For example, wearable electronic devices often utilize thermally insulative materials to interface with a user's body since many soft materials that are suitable for comfortably forming an interface are thermally insulative. Unfortunately, the thermally insulative nature of such materials results in "hot spots" on the user's body as heat unevenly builds up within the pads or other mounting features that physically contact the user's skin. The inclusion of the thermally conductive wires 604 within the brow pad 606 effectively mitigate this issue by providing a high thermal conductivity in the vertical direction. In this way, even when heat is absorbed from the users body and/or from heat sources of the wearable electronic device at a relatively higher rate at the lower portion compared to the upper portion, the heat will quickly spread vertically through the thermally conductive wires in the brow pad to achieve a substantially uniform temperature.

The thermally conductive wires may be interwoven into the thermally conductive textile 602 in a wave pattern to allow for elongation and contraction in a multitude of directions. In this way, the brow pad 606 is enabled to readily adapt and conform to the shape of the user's forehead. In some embodiments, a plurality of thermally conductive wires may extend in multiple directions to enable heat to spread out both vertically and horizontally. For example, in addition to the vertically aligned thermally conductive wires as shown, a plurality of horizontally aligned thermally conductive wires may also be included in various embodiments.

It should be appreciated any reference to "first," "second," etc. items and/or abstract concepts within the description is not intended to and should not be construed to necessarily correspond to any reference of "first," "second," etc. elements of the claims. In particular, within this Detailed Description and/or the previous Summary, items and/or abstract concepts such as, for example, wave patterns and/or locking fibers may be distinguished by numerical designations without such designations corresponding to the claims or even other paragraphs of the Summary and/or Detailed Description. For example, any designation of a "first wave pattern" and "second wave pattern" within a paragraph of this disclosure is used solely to distinguish two different wave patterns within that specific paragraph—not any other paragraph and particularly not the claims.

Example Clauses

The disclosure presented herein may be considered in view of the following clauses.

Example Clause A, a head-mounted display device comprising: a housing assembly that at least partially encloses one or more computing components that emit heat during operation; a display that is mechanically coupled to the housing assembly and that is configured to generate imagery within a field-of-view of a user; and a support assembly to mechanically couple the housing assembly to a head of the user to maintain the display within the field-of-view of the user, wherein the support assembly includes a thermally conductive textile comprised of: an elasticated band for at least partially encircling the head of the user, a plurality of thermally conductive wires that are affixed to the elasticated band in a wave pattern, wherein individual ones of the plurality of thermally conductive wires are in thermal contact with the one or more computing components to transfer the heat from the housing assembly of the head-mounted display device into the thermally conductive textile, and at least one locking fiber that is at least partially affixed to the elasticated band, wherein the at least one locking fiber is configured to limit deformation of the wave pattern by exhibiting a tension spike when the elasticated band is elongated from a first length to a second length.

Example Clause B, the head-mounted display device of Example Clause A, wherein the plurality of thermally conductive wires comprises a plurality of thermally conductive metallic strands that are woven into the elasticated band.

Example Clause C, the head-mounted display device of any one of Example Clauses A through B, further comprising a polymeric coating that is disposed over the plurality of thermally conductive wires that are affixed to the elasticated band.

Example Clause D, the head-mounted display device of any one of Example Clauses A through C, wherein the plurality of thermally conductive wires has a first emissivity and the polymeric coating has a second emissivity, and wherein the first emissivity is greater than the second emissivity.

Example Clause E, the head-mounted display device of any one of Example Clauses A through D, further comprising a two-phase thermal device disposed between the one or more computing components and the plurality of thermally conductive wires that are affixed to the elasticated band, the two-phase thermal device at least partially facilitating the thermal contact.

Example Clause F, the head-mounted display device of any one of Example Clauses A through E, wherein the support assembly further comprises a terminal connection element that is mechanically coupled to the housing assembly.

Example Clause G, the head-mounted display device of any one of Example Clauses A through F, wherein the plurality of thermally conductive wires are metallically joined to the terminal connection element via at least one of: welding, brazing, or soldering.

Example Clause H, the head-mounted display device of any one of Example Clauses A through G, wherein: the plurality of thermally conductive wires includes a plurality of metallic filaments that are woven into the elasticated band in the wave pattern, and the at least one locking fiber includes at least one of: a plurality of cotton filaments that are woven into the elasticated band in a second wave pattern, a plurality of polyester filaments that are woven into the elasticated band in the second wave pattern, or a plurality of poly-cotton filaments that are woven into the elasticated band in the second wave pattern.

Example Clause I, a wearable electronic device comprising: a housing assembly that at least partially encloses a heat source; a support assembly to mechanically couple the housing assembly to a body part of a user, wherein the support assembly includes a thermally conductive textile comprised of: an elasticated band for at least partially encircling the body part of the user, and at least one thermally conductive wire that is at least partially affixed to the elasticated band in a wave pattern to allow for elongation and contraction of the elasticated band between a first length and a second length, wherein individual ones of the at least one thermally conductive wire are in thermal contact with the housing assembly to transfer heat from the housing assembly into the thermally conductive textile of the wearable electronic device.

Example Clause J, the wearable electronic device of Example Clause I, wherein the thermally conductive textile is further comprised of a plurality of locking fibers that restrict elongation of the thermally conductive textile past the second length.

Example Clause K, the wearable electronic device of any one of Example Clauses I through J, wherein stretching the thermally conductive textile to the second length results in the plurality of locking fibers generating a reactive force that is at least five times greater than a combined reactive force of the elasticated band and the at least one thermally conductive wire.

Example Clause L, the wearable electronic device of any one of Example Clauses I through K, wherein the at least one thermally conductive wire is comprised of a plurality of metallic filaments that are woven into the elasticated band in the wave pattern, and wherein the plurality of locking fibers are comprised of a plurality of inelastic filaments.

Example Clause M, the wearable electronic device of any one of Example Clauses I through L, wherein the at least one thermally conductive wire includes a plurality of thermally conductive strands that are coated with a polymeric layer prior to being woven into the elasticated band.

Example Clause N, the wearable electronic device of any one of Example Clauses I through M, wherein the support assembly further comprises a terminal connection element that is mechanically coupled to the housing assembly.

Example Clause O, the wearable electronic device of any one of Example Clauses I through N, wherein the at least one thermally conductive wire is metallically joined to the terminal connection element via at least one of: welding, brazing, or soldering.

Example Clause P, the wearable electronic device of any one of Example Clauses I through O, wherein the thermally conductive textile is further comprised of a polymeric coating that is disposed over the at least one thermally conductive wire to raise an emissivity level of the thermally conductive textile.

Example Clause Q, the wearable electronic device of any one of Example Clauses I through P, wherein the polymeric coating is at least one of an enamel coating or an acrylic coating.

Example Clause R, a method of utilizing a thermally conductive textile for dissipating heat from a wearable electronic device, the method comprising: providing an elasticated band that includes a plurality of elastic fibers extending in a longitudinal direction; weaving a plurality of thermally conductive wires onto the elasticated band in a first wave pattern to form the thermally conductive textile; weaving a plurality of locking fibers onto the elasticated band in a second wave pattern to restrict deformation of the thermally conductive textile in the longitudinal direction; attaching a terminal connection element to at least one end of the thermally conductive textile; and fastening the terminal connection element to a housing assembly of the wearable electronic device to enable heat that is generated within the housing assembly of the wearable electronic device to pass into the plurality of thermally conductive wires that are woven onto the elasticated band in the first wave pattern.

Example Clause S, the method of Example Clause R, further comprising metallically joining the terminal connection element to the plurality of thermally conductive wires.

Example Clause T, the method of any one of Example Clauses R through S, further comprising depositing a polymeric coating to the plurality of thermally conductive wires to increase an emissivity of the thermally conductive textile.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A head-mounted display device comprising:
   a housing assembly that at least partially encloses one or more computing components that emit heat during operation;
   a display that is mechanically coupled to the housing assembly and that is configured to generate imagery within a field-of-view of a user; and
   a support assembly to mechanically couple the housing assembly to a head of the user to maintain the display within the field-of-view of the user, wherein the support assembly includes a thermally conductive textile comprised of:
      an elasticated band for at least partially encircling the head of the user,
      a plurality of thermally conductive wires that are affixed to the elasticated band in a wave pattern, wherein individual ones of the plurality of thermally conductive wires are in thermal contact with the one or more computing components to transfer the heat from the housing assembly of the head-mounted display device into the thermally conductive textile, and
      at least one locking fiber that is at least partially affixed to the elasticated band, wherein the at least one locking fiber is configured to limit deformation of the wave pattern by exhibiting a tension spike when the elasticated band is elongated from a first length to a second length.

2. The head-mounted display device of claim 1, wherein the plurality of thermally conductive wires comprises a plurality of thermally conductive metallic strands that are woven into the elasticated band.

3. The head-mounted display device of claim 1, further comprising a polymeric coating that is disposed over the plurality of thermally conductive wires that are affixed to the elasticated band.

4. The head-mounted display device of claim 3, wherein the plurality of thermally conductive wires has a first emissivity and the polymeric coating has a second emissivity, and wherein the first emissivity is greater than the second emissivity.

5. The head-mounted display device of claim 1, further comprising a two-phase thermal device disposed between the one or more computing components and the plurality of thermally conductive wires that are affixed to the elasticated band, the two-phase thermal device at least partially facilitating the thermal contact.

6. The head-mounted display device of claim 1, wherein the support assembly further comprises a terminal connection element that is mechanically coupled to the housing assembly.

7. The head-mounted display device of claim 6, wherein the plurality of thermally conductive wires are metallically joined to the terminal connection element via at least one of: welding, brazing, or soldering.

8. The head-mounted display device of claim 1, wherein:
   the plurality of thermally conductive wires includes a plurality of metallic filaments that are woven into the elasticated band in the wave pattern, and
   the at least one locking fiber includes at least one of:
      a plurality of cotton filaments that are woven into the elasticated band in a second wave pattern,
      a plurality of polyester filaments that are woven into the elasticated band in the second wave pattern, or
      a plurality of poly-cotton filaments that are woven into the elasticated band in the second wave pattern.

9. A wearable electronic device comprising:
a housing assembly that at least partially encloses a heat source;
a support assembly to mechanically couple the housing assembly to a body part of a user, wherein the support assembly includes a thermally conductive textile comprised of:
an elasticated band for at least partially encircling the body part of the user, and
at least one thermally conductive wire that is at least partially affixed to the elasticated band in a wave pattern to allow for elongation and contraction of the elasticated band between a first length and a second length, wherein individual ones of the at least one thermally conductive wire are in thermal contact with the housing assembly to transfer heat from the housing assembly into the thermally conductive textile of the wearable electronic device.

10. The wearable electronic device of claim 9, wherein the thermally conductive textile is further comprised of a plurality of locking fibers that restrict elongation of the thermally conductive textile past the second length.

11. The wearable electronic device of claim 10, wherein stretching the thermally conductive textile to the second length results in the plurality of locking fibers generating a reactive force that is at least five times greater than a combined reactive force of the elasticated band and the at least one thermally conductive wire.

12. The wearable electronic device of claim 10, wherein the at least one thermally conductive wire is comprised of a plurality of metallic filaments that are woven into the elasticated band in the wave pattern, and wherein the plurality of locking fibers are comprised of a plurality of inelastic filaments.

13. The wearable electronic device of claim 9, wherein the at least one thermally conductive wire includes a plurality of thermally conductive strands that are coated with a polymeric layer prior to being woven into the elasticated band.

14. The wearable electronic device of claim 9, wherein the support assembly further comprises a terminal connection element that is mechanically coupled to the housing assembly.

15. The wearable electronic device of claim 14, wherein the at least one thermally conductive wire is metallically joined to the terminal connection element via at least one of: welding, brazing, or soldering.

16. The wearable electronic device of claim 9, wherein the thermally conductive textile is further comprised of a polymeric coating that is disposed over the at least one thermally conductive wire to raise an emissivity level of the thermally conductive textile.

17. The wearable electronic device of claim 16, wherein the polymeric coating is at least one of an enamel coating or an acrylic coating.

18. A method of utilizing a thermally conductive textile for dissipating heat from a wearable electronic device, the method comprising:
providing an elasticated band that includes a plurality of elastic fibers extending in a longitudinal direction;
weaving a plurality of thermally conductive wires onto the elasticated band in a first wave pattern to form the thermally conductive textile;
weaving a plurality of locking fibers onto the elasticated band in a second wave pattern to restrict deformation of the thermally conductive textile in the longitudinal direction;
attaching a terminal connection element to at least one end of the thermally conductive textile; and
fastening the terminal connection element to a housing assembly of the wearable electronic device to enable heat that is generated within the housing assembly of the wearable electronic device to pass into the plurality of thermally conductive wires that are woven onto the elasticated band in the first wave pattern.

19. The method of claim 18, further comprising metallically joining the terminal connection element to the plurality of thermally conductive wires.

20. The method of claim 18, further comprising depositing a polymeric coating to the plurality of thermally conductive wires to increase an emissivity of the thermally conductive textile.

* * * * *